(12) United States Patent
Gavin

(10) Patent No.: US 7,076,600 B2
(45) Date of Patent: Jul. 11, 2006

(54) DUAL PURPOSE INTERFACE USING REFRESH CYCLE

(75) Inventor: Vincent Gavin, Galway (IE)

(73) Assignee: 3Com Corporation, Marlborough, MA (US)

( * ) Notice: Subject to any disclaimer, the term of this patent is extended or adjusted under 35 U.S.C. 154(b) by 679 days.

(21) Appl. No.: 10/267,826

(22) Filed: Oct. 10, 2002

(65) Prior Publication Data

US 2003/0088730 A1    May 8, 2003

(30) Foreign Application Priority Data

Nov. 8, 2001   (GB) ................. 0126863.0

(51) Int. Cl.
*G06F 12/00* (2006.01)
(52) U.S. Cl. .............. 711/105; 711/100; 711/104; 711/106; 711/167; 711/168; 365/222; 365/223; 365/230.04; 365/230.05; 365/230.06; 365/240; 365/236; 710/20; 710/21; 710/36; 710/38; 710/1; 710/7
(58) Field of Classification Search ............ 711/100, 711/104–106, 167–168; 365/222–223, 230.04–230.06, 365/240, 236; 345/521, 541, 542, 544; 710/1, 710/7, 20–21, 36, 38
See application file for complete search history.

(56) References Cited

U.S. PATENT DOCUMENTS

| 4,991,112 | A  | * | 2/1991 | Callemyn ............... 345/535 |
| 5,487,157 | A  | * | 1/1996 | Mizugaki ............... 712/244 |
| 6,188,627 | B1 | * | 2/2001 | Blackmon et al. ....... 365/222 |
| 6,222,564 | B1 | * | 4/2001 | Sturges ................ 345/531 |
| 6,222,785 | B1 | * | 4/2001 | Leung ................. 365/222 |
| 6,563,754 | B1 | * | 5/2003 | Lien et al. ............ 365/222 |
| 6,741,515 | B1 | * | 5/2004 | Lazar et al. ........... 365/222 |

* cited by examiner

*Primary Examiner*—B. James Peikari
*Assistant Examiner*—Zhuo H. Li
(74) *Attorney, Agent, or Firm*—Nixon & Vanderhye, PC

(57) ABSTRACT

A method and system for optimizing use of signal paths on a DRAM interface. Signal paths that have a 'don't care' status during DRAM refresh are assigned to communication with another device. Onset of the refresh procedure triggers diversion of shared signal paths away from the DRAM to the other device for the duration of the refresh the shared signal paths include at least some of the address and data signal paths.

8 Claims, 5 Drawing Sheets

DUAL PURPOSE INTERFACE USING REFRESH CYCLE

FIELD OF THE INVENTION

This invention relates to input/output signal paths and to multipurpose use of DRAM interface signal paths.

BACKGROUND OF THE INVENTION

Application specific integrated circuits (ASICS) that require large numbers of pins for their input and output signals are more expensive to package than those with fewer pins. It is therefore of advantage if the pin numbers can be minimized.

A common interface provided on a system on chip (SOC) ASIC is a DRAM interface as many such ASICs link to a DRAM for the main memory functions.

State of the art synchronous DRAMs are usually organised internally into several banks, typically four, and have inputs for various command and address signals. To maintain the state of stored data it is necessary to refresh the memory cells within a predetermined maximum time. A typical time is 64 ms.

A 128 Mb SDRAM configured as a quad-bank typically has 134,217,728 cells (or bits), each bank having 33,554,432 bits organised as 4,096 rows by 256 columns by 32 bits. Refresh is conducted row by row, each of the 4,096 rows of each bank requiring refresh every 64 ms. This refresh may be achieved by a burst of 4,096 refresh operations to each bank every 64 ms, or more usually by performing a refresh command to a given row in each bank every 15.625 µs.

With these multi-bank SDRAM chips, refresh operation is conducted simultaneously on all banks, during which time no data operations are carried out.

SUMMARY OF THE INVENTION

During the time when the banks of the SDRAM are idle, signal paths, and their associated interface pins, that have a 'don't care' status are utilised for other purposes.

According to the invention there is provided a method of optimizing signal paths on a DRAM interface, the method comprising reassigning at least some of the data and address signal paths of the DRAM interface to communicate with a device other than the DRAM for at least some of the time period of DRAM refresh procedures.

The invention also provides a system for controlling use of signal paths in a DRAM interface in which during refresh periods of the DRAM at least some of the signal paths that are idle during the refresh period are assigned to communication with another device.

BRIEF DESCRIPTION OF THE DRAWINGS

The invention is now described by way of example with reference to the accompanying drawings in which.

DETAILED DESCRIPTION OF PREFERRED EMBODIMENT

Figure 1:
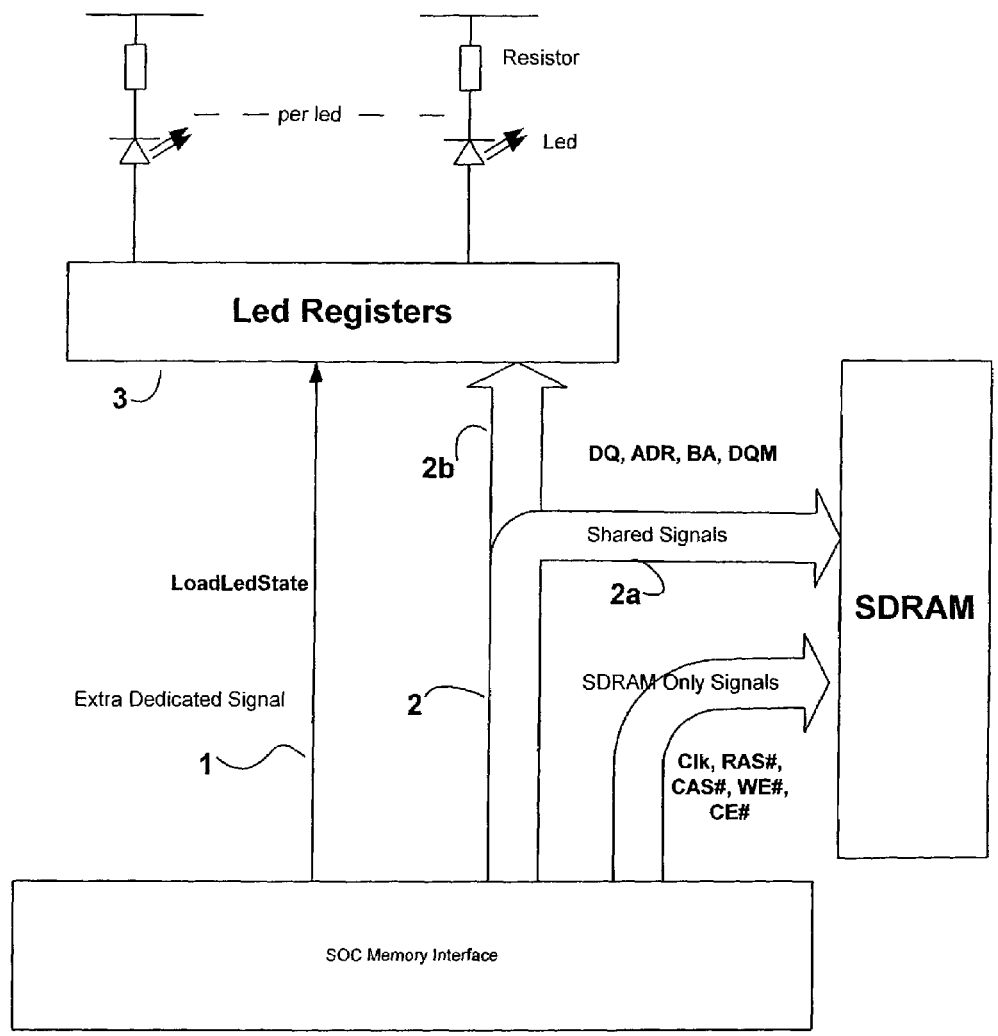
FIG. 1 is a schematic diagram of a first embodiment of the invention with shared signal paths driving LEDs.

A typical state of the art SDRAM such as a Micron 48LC4M32B-2 which has 1 Meg×32 bit×4 banks, has 86 pins on to which control signals as well as power supply and ground connections are variously made. The main signal inputs are:

| | |
|---|---|
| CLK | The clock, driven by the system clock. |
| CKE | Clock enable, can activate and deactivate the CLK signal (for the purposes of this description may be assumed to be tied HIGH for CLK enabled). |
| CS# | Chip select enables (Low) and disables (HIGH) the command decoder. |
| WE# | Write Enable. |
| CAS# | Column Address Strobe. |
| RAS# | Row Address Strobe. |
| DQM0,1,2,3 | Input/Output mask. |
| BA0,1 | Bank Address inputs. |
| A0–A11 | Address inputs. |
| DQ0–DQ31 | Data inputs and outputs. |

When CS# is in the enabled state, RAS#. CAS# and WE# define the command. Depending upon the settings of the command signals the following commands can be issued.

COMMAND INHIBIT CS# high prevents new commands from being executed by the SDRAM.

NO OPERATION (NOP) CS# low, RAS#, CAS# and WE# high prevents unwanted commands from being registered.

LOAD MODE REGISTER CS#. RAS#, CAS# and WE# all low, mode register loaded via A0–A10.

ACTIVE Opens a row. CS# and RAS# low, CAS# and WE# high, BA0 and BA1 give bank address, A0–A11 row address.

READ CS# and CAS# low, RAS# and WE# high BA0 and BA1 select bank, A0–A7 selects starting column. A10 determines whether or not AUTO PRECHARGE is used. DQM0–DQM3 control which DQ data is read. When a DQM is low it controls reading of data from its corresponding 8 DQs two clock cycles later.

WRITE CS#, CAS# and WE# low, RAS# high BA0 and BA1 select bank, A0–A7 selects starting column. A10 determines whether AUTO PRECHARGE. DQM0–DQM3 control which DQ data is written to memory. When a DQM is low contemporary data on its corresponding 8 DQs is written to memory.

PRECHARGE CS#. RAS# and WE# low, CAS# high A10 determines whether one or all banks precharged. If one bank is PRECHARGED (A10 low) BA0 and BA1 are required for the bank select.

AUTO REFRESH CS#, RAS# and CAS# low, WE# high. Addresses are generated by an internal refresh controller.

For the purposes of illustration in the invention, AUTO REFRESH will instigate a refresh of one row of each bank every 15.625 µs, as is required for this state of the art device. Alternative refresh cycles such as a burst of 4,096 refresh operations every 64 ms could be utilised in a comparable way as will be described below for the 15.625 µs cycle, with modification to suit the different timing. A 4,096 burst refresh would take 4,096 cycles plus the refresh access time of, in this example, 5 cycles.

During AUTO REFRESH, which is applied to all banks under the control of the internal refresh controller, the two bank selects and the twelve address inputs are 'don't care'. As data operations are suspended (banks idle) during refresh the four DQM inputs and thirty two data input/output signals are also 'don't care'. This is a total of 50 bit lines.

From the issue of the AUTO REFRESH command there is a period of 60 ns before an access to the DRAM can be performed. For an interface running at 100 MHz (10 ns period) this gives 6 clock cycles. Thus 50 bit lines are available for 6 clock cycles every 15.625 µs.

This gives $$\frac{50 \times 6}{15.625 \times 10^{-6}} = 19.2 \text{ Mbits/second}$$

Alternatively just the 32 bits of the data bus (DQ) could be used for data and the other pins of DQM, ADR (A0–A11) and BA used for control and address.

This gives $$\frac{32 \times 6}{15.625 \times 10^{-6}} = 12.288 \text{ Mbits/second}$$

This provides significant data rates for no additional pin overhead. In alternative refresh schedules, e.g. the burst refresh of the entire SDRAM, a longer availability occurs but less frequently.

The extra facility created by using the idle lines for other purposes can be used for driving other external devices. A particular implementation shown in FIG. 1 is to drive LEDs.

Often a large number of LEDs are utilised to provide real time status indications to the user of a system. For example most ethernet ports provide a link status and an activity LED, which requires 48 LEDS for a 24 port device. If each LED requires its own pin this gives a considerable fabrication overhead.

In the proposed implementation of the invention an additional dedicated signal, shown by arrow 1 in FIG. 1, is provided which asserts during a refresh cycle to select an alternative external device and the 50 bit lines, represented by the line 2, are diverted from the normal path 2a into the SDRAM along path 2b and are used to load the external device. The diversion may typically be via a multiplexer. In this implementation the external device is an external register 3 that holds the status of 50 LEDs. The reload to the register occurs every refresh cycle, i.e. 15.625 µs in this example, which enables flashing LEDs to be used without the flashing being distinguishable to the human eye. Indeed, any flashing faster than 32 ms would appear permanently on so this particular implementation could be used with a variety of different refresh intervals should such configurations prove desirable for other purposes.

During the interval in which refresh occurs, a write value of, say, 1 for ON or 0 for OFF, is loaded into the LED register which holds that state until the next refresh cycle when the register is reloaded.

The LEDs may be supplied with a continuous series of ON signals to give an ON indication or operated in an energy saving, flashing mode in which they are turned on and off at a rate not discernable to the human eye. This would involve writing '1' during a few refresh cycles then '0' for a few refresh cycles and so on.

Figure 2:
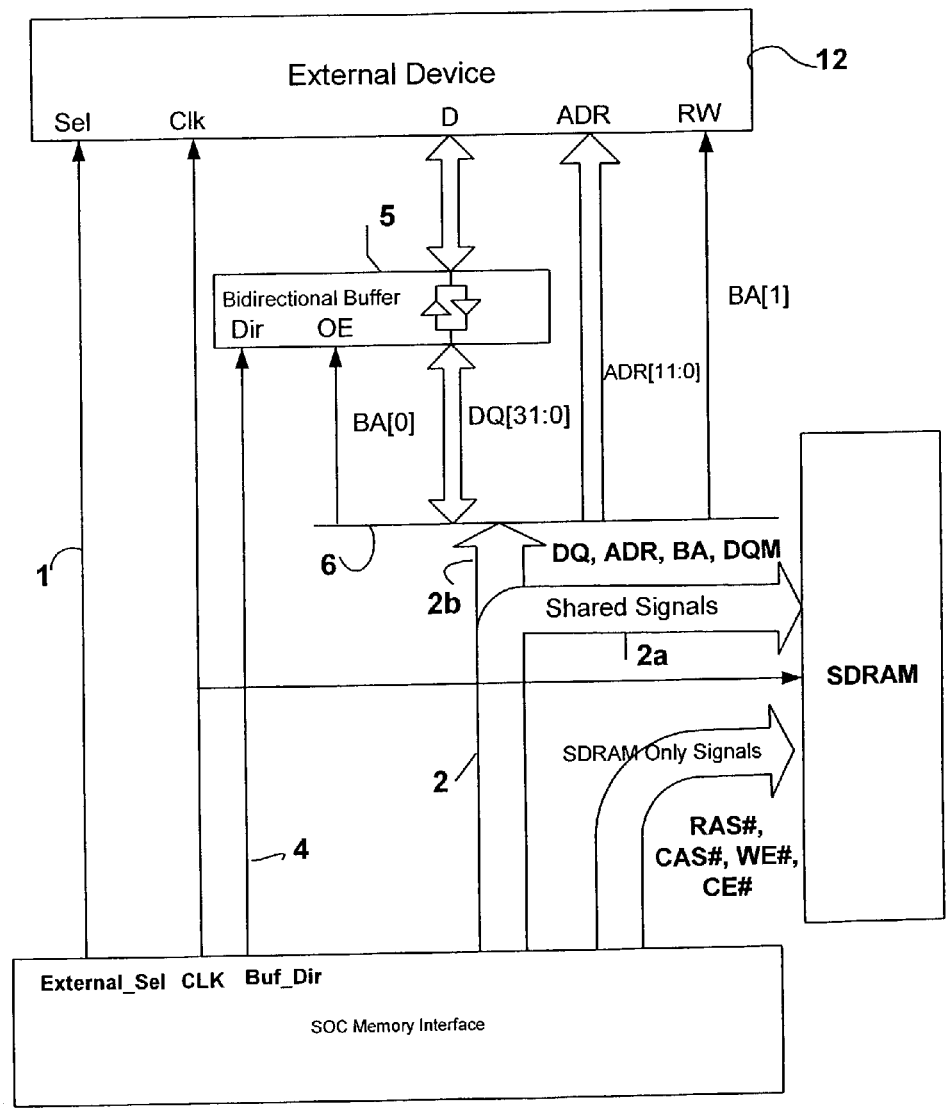
FIG. 2 is a schematic diagram of a more complex second embodiment incorporating an interface protocol for communicating with an external read/write device.

FIG. 2 illustrates a more complex implementation that includes an interface protocol for running bi-directional data over the DRAM interface during the refresh cycle. The protocol may be generic to provide a standard interface or specific for interfacing to a particular set or type of device.

In FIG. 2 the additional external select signal on line 1 is again used to select the external device, now referenced 12, during refresh cycles of the SDRAM and to ensure that the external device is deselected during SDRAM data operations.

A second additional signal 4 is provided as a directional control for bi-directional buffers connected to the branch 2b of the shared data bus. This ensures that data from the external device is only driven on to the shared SDRAM bus during permitted Read cycles from the external device.

The exemplary implemented protocol illustrated in FIG. 2 provides a 32 bit interface 6 using 12 bits of address to allow an address space of 4K long words (16K Bytes) to be addressed.

DQ [31:0] are used for the 32 bit data signals to the external device during the access along path 2b.

ADR [11:0] are the addresses used for the external device.

BA [0] is used as output enable control for external transceivers.

BA [1] controls whether a read or write access for the external device (high for Read, low for Write).

The DQM signals are not used in this example, but could be used to support Byte Writes to external space.

Figure 3:
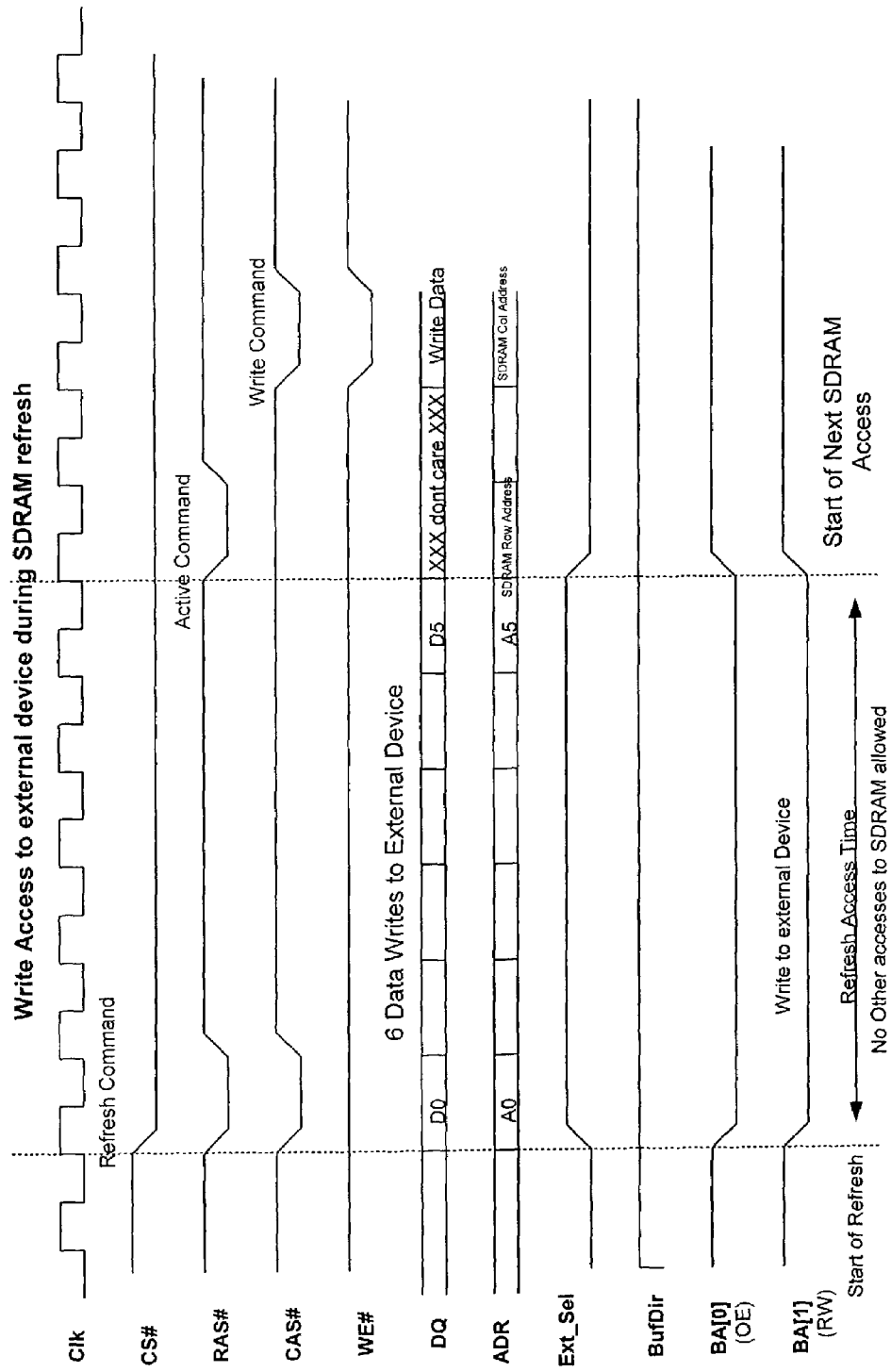
FIG. 3 is a schematic timing diagram for a write access to the external device of FIG. 2 during SDRAM refresh.

Referring now to FIG. 3, the signals and timing for a Write Access to the external device of FIG. 2 are shown. It will be noted on FIG. 2 that the clock signal CLK is provided to the external device 12 as well as to the SDRAM (as usual).

The refresh cycle is implemented by the AUTO REFRESH commands of CS#, RAS# and CAS# going low and WE# high. The Ext-Sel external select signal is asserted to select the external device, and the address in external device space and the write data are driven on to the ADR and DQ buses respectively. The BufDir signal is held high so that when the output enable signal on BA [1] is asserted by going low, data is driven on to the data bus to the external device. BA [1] asserted (low) indicates to the external device that there is a write cycle and data is written to the external device on each clock edge. For the usual refresh period, no accesses are possible to the SDRAM for 6 clock cycles, so a burst of 6 writes can be performed to the external device.

At the end of the burst, the Ext-Sel signal is deasserted by going low, and the external device ignores other input signals, Address, Data, RW etc, which revert to SDRAM use. BufDir remains high so that if BA [0] is deasserted (low) during SDRAM accesses, data is not driven onto the SDRAM bus from the external device.

After the refresh period has finished, the first command to the SDRAM is an ACTIVE command, addressed to a specific bank and row, and the column address follows with the SDRAM write command, as shown in FIG. 3.

Figure 4:
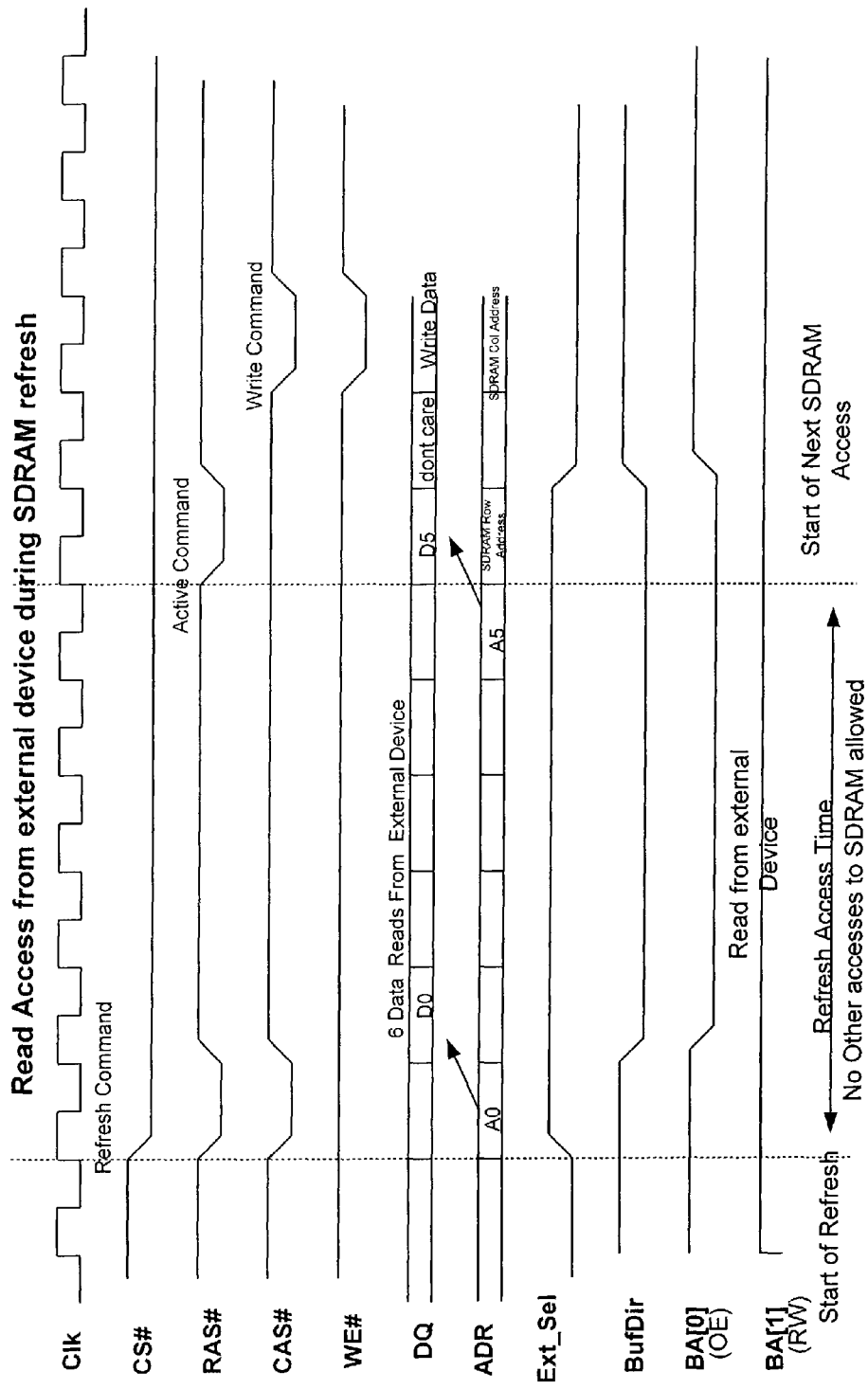
FIG. 4 is a schematic timing diagram for a read access from the external device of FIG. 2 during SDRAM refresh.

FIG. 4 illustrates the timing Read Access to the external device. As with the external write, the Ext-Sel is asserted and the address is driven on to the ADR line. The BufDir is not asserted until the next clock cycle, which prevents data from being driven on to the SDRAM bus while the ASIC state may not be settled. The output enable on BA [0] is also asserted on this second clock cycle.

BA [1] remains high, which is detected by the external device on the first clock cycle as indicating a read cycle, and data is driven out on the second (next) cycle. It will be appreciated that for the external read the data is a clock cycle behind the address, in contrast to the external write where it is coincident. This means that on the sixth cycle the sixth address has been asserted but the data has not been returned. However, as the SDRAM requires only the address lines for generating the active command the data bus remains available and the sixth read is returned overlapping with the Active command to the SDRAM. This requires that the Ext-Sel signal stays high for a seventh cycle, and BufDir and OE return high to isolate the external device also after the seventh cycle from the start of the refresh, although unlike Ext-Sel their change of state has only lasted six cycles as it was implemented on the second cycle. This overlap is also facilitated by the fact that two cycles are required from the Active command before an SDRAM data operation so the second of these (eighth from start of refresh) accommodates the bus turn around time changing from the external device to the ASIC driving the write data to the SDRAM.

Figure 5:
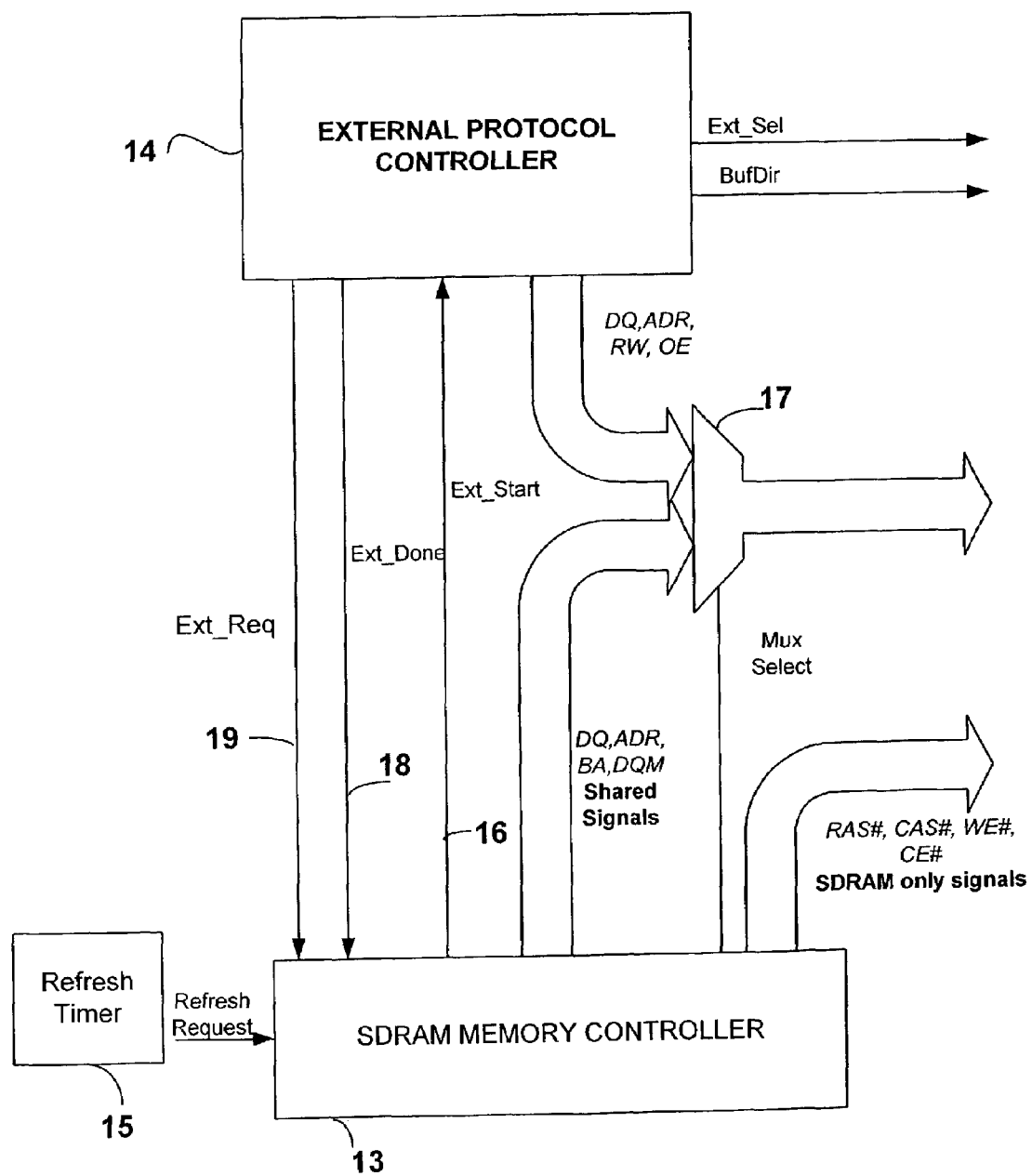
FIG. 5 is a schematic diagram of functionality inside an ASIC corresponding to the implementation illustrated in FIGS. 2 to 5.

If the SDRAM operation prior to the refresh was a read, the read operation has to be completed before starting the refresh cycle. There will again be a lag before the read data is returned to the SDRAM and the data lines are not available (BufDir and OE can not change state) until that data has been returned plus turnaround time (if required). The control of the timing is performed by an external protocol controller that can be provided, usually, in the ASIC. The functional operation of an ASIC including such an external protocol controller is illustrated in FIG. 5. There may be instances where the external protocol is not on the ASIC, but operationally provides equivalent connection and functionality.

Within the ASIC the SDRAM memory controller 13 allows an external protocol 14 to gain access to the SDRAM bus during the relevant refresh cycle period.

A counter timer 15 indicates when a refresh period has passed and generates a request to the memory controller to indicate that a refresh should be performed, and when the current access to the SDRAM has finished the refresh cycle is started.

When the refresh cycle is initiated the memory controller indicates this by an Ext-Start signal 16 to the external protocol controller and enables the data path via a select multiplexer 17 so that the signals are under the control of the external protocol controller. The SDRAM memory controller will enable the signal and data lines via the multiplexer in accordance with timing dependent upon the previous SDRAM operation, the access to the data lines lagging when there has been a previous read.

In this implementation the External protocol controller is given some timing flexibility to extend external operation, as will be described later, but it would be possible to run on a six cycle only timing.

On completion of the external access, the External Protocol controller indicates completion to the memory controller with an Ext-Done signal 18 and the SDRAM takes back control of the SDRAM signals, allowing for data read lag for the data lines as appropriate. If this is, as is generally envisaged, completed within the time made available by the refresh process, then no bandwidth is lost in SDRAM operation. However, for some purposes, especially such as initialization processes, it may be desirable to allow extended access to the data lines to the external device. To support this the External Protocol controller may have a further Ext-Req signal to indicate that it wishes to access the SDRAM bus at times other than during refresh. After the special access or extended access, the external protocol controller would continue operation only using the refresh period.

Within this specification the expression 'refresh period' and 'refresh operation' is to be interpreted as relating to the refresh cycles and when appropriate also the cycles required from the Active command to data operation.

The invention claimed is:

1. A memory system comprising:
    a dynamic random access memory having an automatic refresh cycle;
    a memory data bus defining a first group of signal paths for signals including column address strobe, row address strobe and write enables signals and a second group of signal paths for signals including data signals;
    a memory bus interface controller configured to provide signals on said first group and said second group of signal paths to said dynamic random access memory wherein during said automatic refresh cycle access to said dynamic random access memory for signals on said first group of signal paths is allowed and access to said dynamic random access memory group for signals on said second signal paths from said memory controller is prevented; and wherein said memory bus interface controller is responsive to the commencement of said automatic refresh cycle to provide during said refresh cycle an external select signal; and
    an external device coupled to said memory bus interface controller for enabling, by assertion of said external select signal, access via said second group of signal paths and thereby to receive said data signals and for disabling by de-assertion of said external select signal during data access to said dynamic random access memory.

2. A memory system as in claim 1 wherein said external device comprises an external register and further comprising a set of light-emitters controlled by said external register, whereby said light-emitters flash at a rate corresponding to a repetition rate of said automatic refresh cycle.

3. A memory system as in claim 1 and further comprising a bi-directional buffer coupled to said second group of signal paths and said external device and wherein said memory bus interface controller is operative to provide during said automatic refresh cycle a directional control signal to said birectional buffer.

4. A memory system as in claim 1 wherein said signals on said second signal paths include bank address signals and wherein said memory bus interface controller provides said bank address signals to said external device during said automatic refresh cycle.

5. A method of operating a memory system including a dynamic random access memory having an automatic refresh cycle and a memory data bus defining a first group of signal paths for signals including column address strobe, row address strobe and write enable signals and a second group of signal paths for signals including data signal, said method comprising:
    generating signals on said first group and said second group of signal paths to said dynamic random access memory wherein during said automatic refresh cycle access to said dynamic random access memory for signals on said first group of signal paths is allowed and access to said dynamic random access memory group for signals on said second signal paths from said memory controller is prevented and, responsive to the commencement of said automatic refresh cycle, providing during said refresh cycle an external select signal; and enabling, by assertion of said external select signal, access to an external device via said second group of signal paths and thereby to receive said data signals and for disabling by de-assertion of said external select signal during data access to said dynamic random access memory.

6. A method as in claim 5 wherein said external device comprises an external register and said method further comprising:
   controlling a set of light-emitters by said external register, whereby said light-emitters flash at a rate corresponding to a repetition rate of said automatic refresh cycle.

7. A method as in claim 5 wherein a bi-directional buffer is coupled to said second group of signal paths and said external device and wherein said method further comprises:
   providing during said automatic refresh cycle a directional control signal to said bi-directional buffer.

8. A method as in claim 5 wherein said signals on said second signal paths include bank address signals and wherein said method further comprises:
   providing said bank address signals to said external device during said automatic refresh cycle.

* * * * *